(12) United States Patent
Hedberg et al.

(10) Patent No.: US 6,696,890 B2
(45) Date of Patent: Feb. 24, 2004

(54) DIFFERENTIAL SIGNAL TRANSFER CIRCUIT

(75) Inventors: Mats Olof Joakim Hedberg, Haninge (SE); Tord Haulin, Uppsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 8 days.

(21) Appl. No.: 10/143,668

(22) Filed: May 8, 2002

(65) Prior Publication Data

US 2002/0175749 A1 Nov. 28, 2002

(30) Foreign Application Priority Data

May 11, 2001 (EP) .............................................. 01111189

(51) Int. Cl.[7] .............................. H03F 1/02; H03F 3/45
(52) U.S. Cl. .......................................... 330/9; 330/258
(58) Field of Search ............................ 330/9; 9/69, 258

(56) References Cited

U.S. PATENT DOCUMENTS

| | | | |
|---|---|---|---|
| 4,714,895 A | 12/1987 | Nicollini et al. | 330/258 |
| 4,887,048 A * | 12/1989 | Krenik et al. | 330/258 |
| 5,638,020 A * | 6/1997 | Koifman et al. | 327/382 |
| 5,963,156 A | 10/1999 | Lewicki et al. | 341/122 |

FOREIGN PATENT DOCUMENTS

| | | |
|---|---|---|
| EP | 0 840 442 A1 | 5/1998 |
| GB | 2 113 030 A | 7/1983 |

OTHER PUBLICATIONS

Tyberghien, G., European Search Report completed Sep. 20, 2001 for EP01111189, (2 pgs.).

* cited by examiner

Primary Examiner—Khanh Van Nguyen

(57) ABSTRACT

A differential signal transfer circuit to control the common mode level of a differential signal, comprising an input common mode level detection circuit, for detecting the common mode level of an incoming signal, two capacitors coupled between the first input and output and the second input and output respectively, and a control circuit adapted to control an output common mode voltage level at the output terminals by controlling the levels of charge on the two capacitors dependent on the common mode level of the incoming signal as detected by the input common mode detector.

14 Claims, 7 Drawing Sheets

DIFFERENTIAL SIGNAL TRANSFER CIRCUIT

TECHNICAL FIELD OF THE INVENTION

Differential digital signals are used for carrying digital data coded as a difference voltage between a pair of conductors. This data format has the advantage of being more immune to noise and cross talk than are single ended signals. The noise immunity is based on impedance balance and common mode rejection. For properly designed conductor pairs, noise and cross talk impact the two branches of a differential pair in a similar fashion. Impact on the differential signal component is limited. This first order noise suppression can be maintained also when connecting transmitters and receivers to the differential line, given that their impedances are well balanced.

In order to exploit this means for noise suppression, a differential line receiver must be able to interpret solely the differential signal component, while essentially ignoring common mode signal components. The range of common mode voltages where a receiver has this capability is called the common mode range.

The common mode signal components a differential receiver is subjected to are often dominated by a DC offset. In most cases, this is different from the optimum common mode level for the receiver. On top of the DC offset is a whole spectrum of unwanted common mode signals originating from cross talk and ground currents creating offset voltages between transmitter and receiver grounds. Longer lines are subjected to more common mode noise. For well designed longer transmission lines, however, the common mode noise is low pass filtered much more than the differential signal component. Therefore it would be desirable to high-pass filter the input signal before entering the differential receiver. For ordinary base band data however, this cannot be done since the differential and common mode spectra overlap. As an example, for NRZ coded data the differential spectrum goes all the way down to DC.

DESCRIPTION OF THE PRIOR ART

EP 0840442 A1 and U.S. Pat. No. 4,714,895 are examples of differential amplifiers having a switched capacitor network to detect the common mode signal at the amplifier output, the output value of the switched capacitor network being fed back to the amplifier to enable compensation. Differential input amplifiers with differential outputs are used. These amplifiers have differential feedback networks determining the main properties of the filter. Since all signal processing is purely differential, the common mode level is a don't care. Any common mode voltage where the amplifiers can process the differential signals will satisfy the differential feedback network.

Common mode control is provided to ensure that the amplifier operates within the limits imposed by the power supply. This is often referred to as "common mode feedback" for differential output amplifiers. The Common mode feedback network senses the common mode level of the amplifier output and modulates the biasing of the amplifier to keep the common mode voltage within bounds.

Although the common mode level of a differential signal is controlled, the known common mode feedback technique cannot be used for adjusting the input common mode level to an amplifying element. The known common mode feedback network adjusts the output common mode level from a linear amplifier to avoid clipping in that amplifier.

STATEMENT OF INVENTION

Among the objects of this invention is the circumvention of the drawbacks of the prior art discussed above. In particular, the purpose of this invention is to create a differential transfer circuit that can operate under optimum conditions with input signals having a wider range of common mode voltages and/or currents.

According to the present invention, the input to a differential receiver is first passed through a differential transfer circuit, which substantially removes the common mode component of the differential signal by means of controlling the charge on capacitors coupled between each of the differential transfer circuit inputs and each of the differential receiver inputs respectively, dependent on the common mode level of the signal.

Preferably, this is done using switched capacitor circuitry.

Preferably, one switched capacitor circuit is provided for each of the capacitors coupled between each of the differential transfer circuit inputs and each of the differential receiver inputs.

Preferably, each switched capacitor circuit comprises a further capacitor, a first and second switching device, which are switched in an in phase manner by said clock circuit so as to alternately connect, in a first stage of said clock's cycle to connect said switched capacitor across the output signal of an input common mode level detection device, representing the common mode level on the incoming signal, and a reference level, and in a second stage of said clock's cycle said further capacitor in parallel with the first or second capacitor with which said charge control circuit is associated.

Preferably the reference level is the same for each switched capacitor circuit. Different reference levels may be provided if the generation of a differential DC offset across the output terminals of the differential signal transfer circuit is desired, e.g. for compensating the amplifier receiving the output signals from the differential transfer circuit.

The switching of the switched capacitor circuits may be controlled by a common clock, or a separate clock may be provided for each switched capacitor circuit.

Where separate clocks are provided for each switched capacitor circuit, the clocks may, or may not oscillate at the same frequency.

Where separate clocks are provided for each switched capacitor circuit, and do oscillate at the same frequency, they may, or may not be in phase with one another, Preferably the frequency of the cycle of the clock circuits is higher than twice the highest frequency in the common mode voltage spectrum at an appreciable power level, for example 20 dB below the differential signal power, at the input of the differential transfer circuit.

Preferably the switching devices are implemented using transistor transmission gates.

Preferably the input common mode is detected using a first and a second resistive element coupled in series across the first and second input lines so as to form a potential divider arrangement, the voltage between the two resistors being representative of the common mode value of the input signal.

Preferably, the common mode component of a differential signal Vin is processed without using amplifying elements. This makes it possible to operate on the input signal to a digital signal receiver or to a linear amplifier (6) for the purpose of making the input signal common mode variations that the receiver is subjected to much less than the common mode variations of the input signal Vin to the differential signal transfer circuit.

DESCRIPTION OF THE DRAWINGS

FIG. 4b Shows details of the embodiment of an implementation of the charge control circuits the embodiment of FIG. 4a.

DETAILED DESCRIPTION OF THE PREFERRED EMBODIMENTS

The reference symbols consistently refer to the same or corresponding elements throughout the figures.

Figure 1:
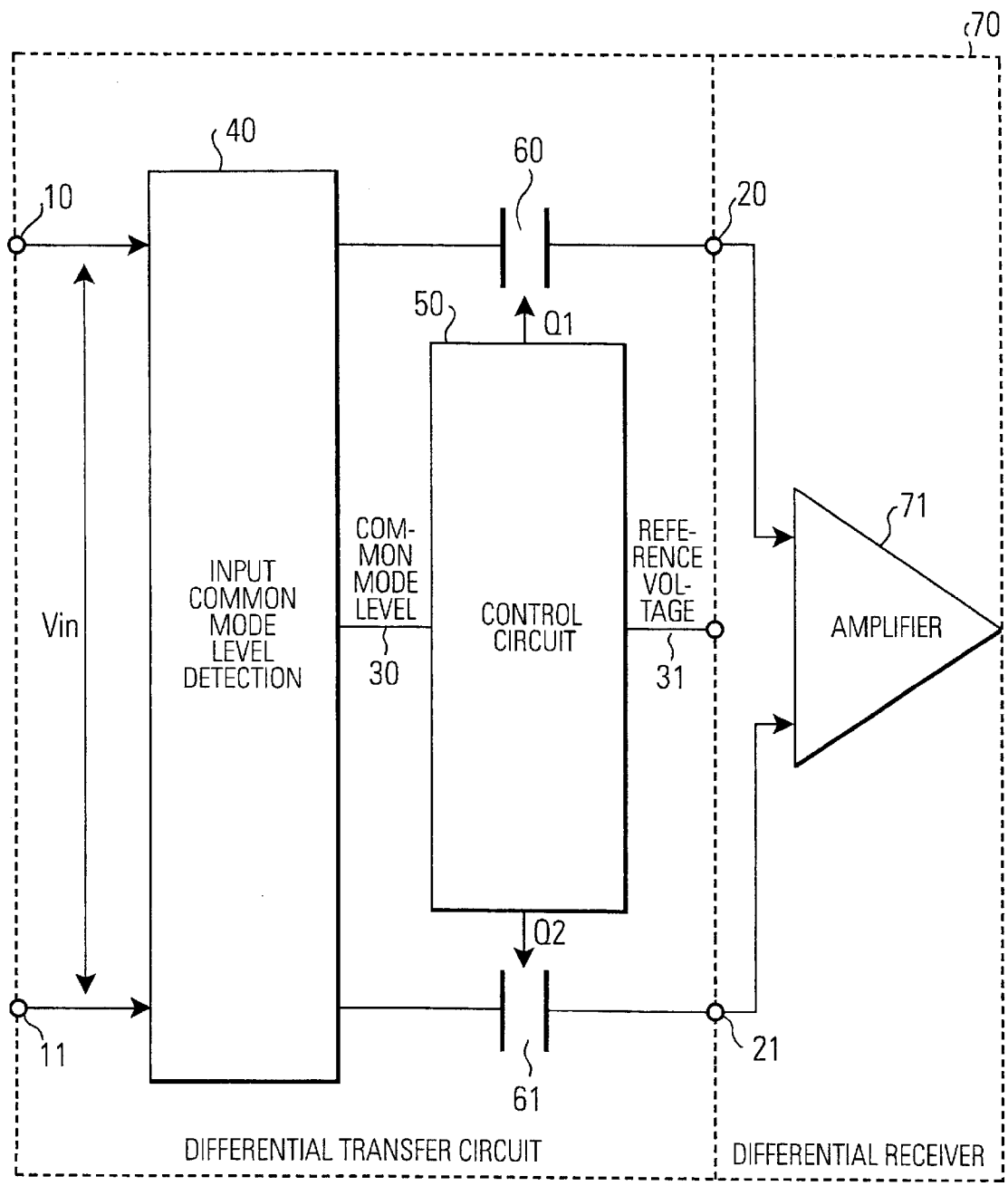
FIG. 1 Is a block diagram of a basic embodiment of the invention.

FIG. 1 is a block diagram of an embodiment of a differential signal transfer circuit according to the invention. The differential signal transfer circuit has a pair of differential input ports 10, 11, a pair of differential output ports 20, 21 and an input 31 for reference values representing the desired DC offset of the output differential signal. A capacitor 61 is provided between the n input 11 and the n output 21, and 60 between the p input 10 and the p output 20. On the input side, the common mode part of the input signal is detected by a common mode level detection circuit 40.

A control circuit 50 is provided, which performs the function of comparing the common mode value 30 detected by the input common mode level detection device 40, to the desired level on the reference level input 31, and adding in accordance with the detected input common mode level, charge to the capacitors 60, 61, thereby adding the difference voltage between the values 30 and 31 to each of the two input differential signals before being presented in the differential output 20, 21.

Figure 2:
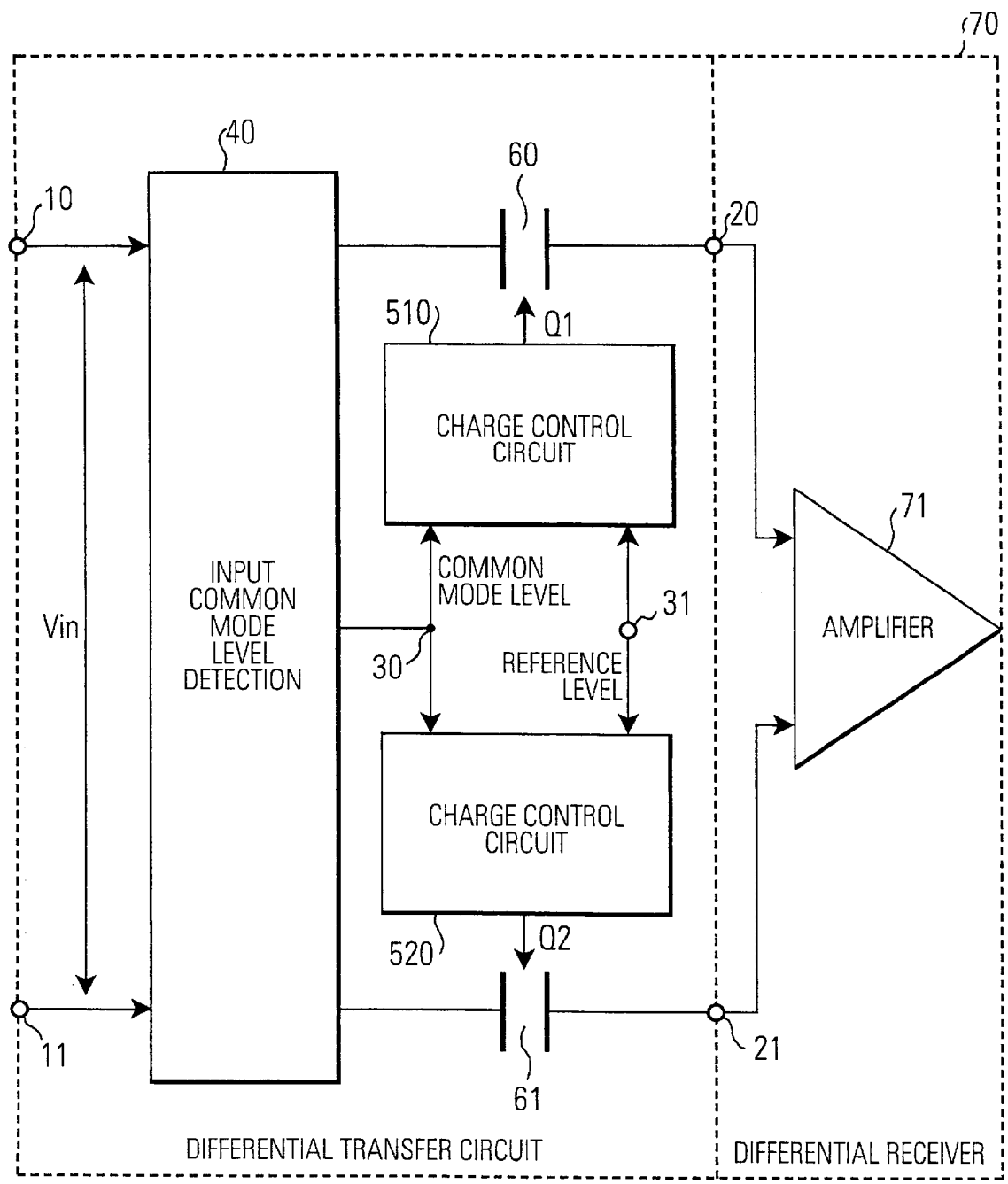
FIG. 2 Shows an embodiment of the charge control circuits in the embodiment of FIG. 1.

FIG. 2. shows a further basic embodiment of the invention. In FIG. 2, all elements are the same as in FIG. 1 except that the function of the control circuit is realised by two Charge control circuits 510 and 520, dedicated to controlling the charge on the capacitors 60 and 61 respectively. Charge control circuit 510 performs the function of comparing the common mode value 30 detected by the input common mode level detection device 40, to the desired level on the reference level input 31.

Charge is added to the capacitor 60 thereby adding a voltage corresponding to the difference voltage between the nodes 30 and 31 to the input differential signal 10 before being presented in the differential output 20. Charge control circuit 520 performs the function of comparing the common mode voltage at node 30 detected by the input common mode level detection device 40, to the desired level on the reference level input 31.

Charge is added to or removed from the capacitor 61 thereby adding a voltage corresponding to the difference voltage between the nodes 30 and 31 to the input differential signal 11 before being presented at the differential output 21. In this way the common mode on the differential signal between the two inputs is substantially eliminated or at least reduced.

Figure 3:
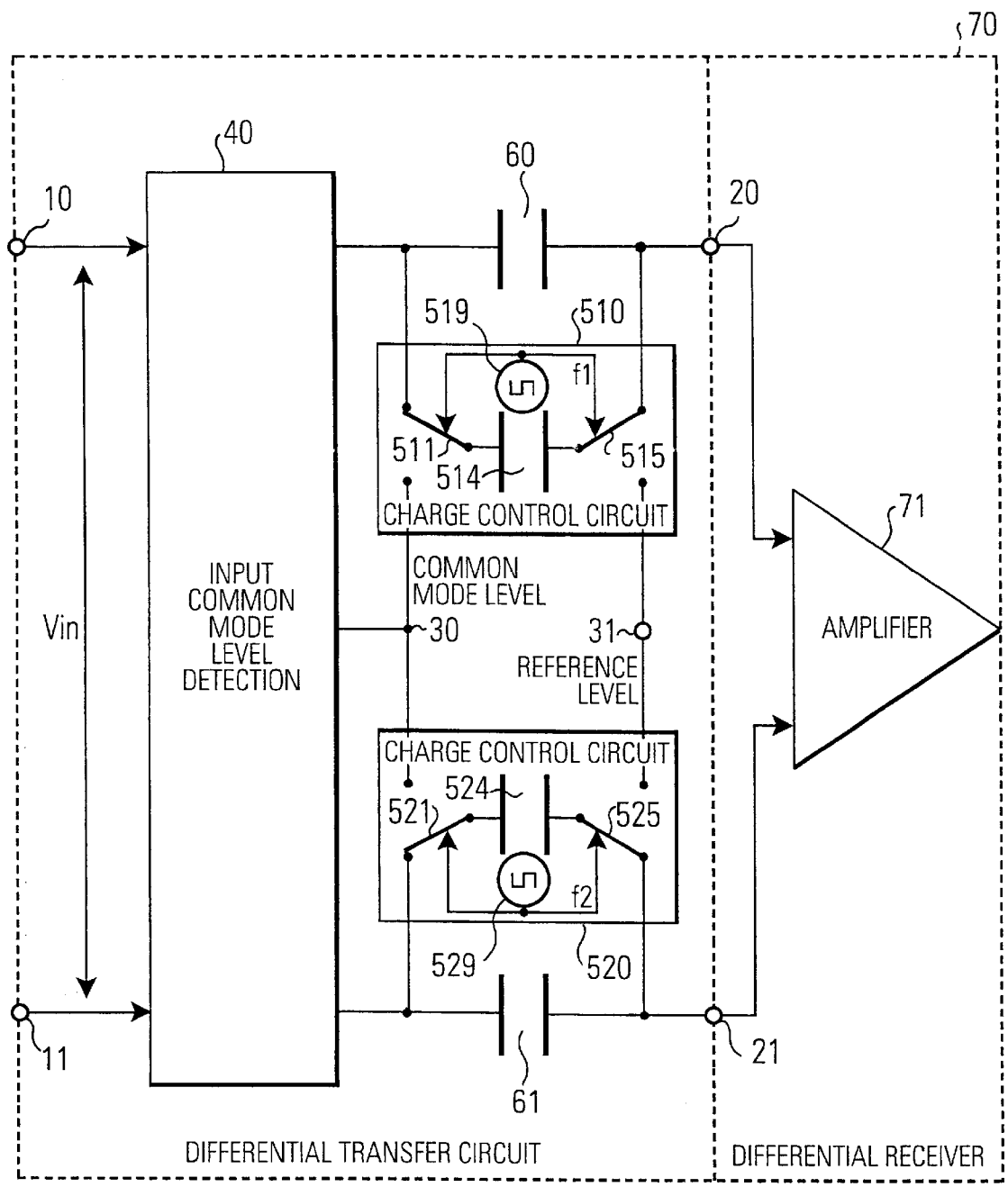
FIG. 3 Shows an embodiment of an implementation of the charge control circuits of the embodiment of FIG. 2.

FIG. 3 is a block diagram of an embodiment of a differential signal transfer circuit according to the invention. The differential signal transfer circuit has a pair of differential input ports 10, 11, a pair of differential output ports 20, 21 and an input 31 for a reference value representing the desired common mode level of the output differential signal. A capacitor 61 is provided between the n input 11 and the n output 21, and a capacitor 60 is provided between the p input 10 and the p output 20. On the input side, the common mode part of the input signal is detected by a common mode level detection circuit 40.

In this embodiment the charge control circuit functions are realised using a switched capacitor arrangement. The charge control circuit 510 comprise the following elements:

Reference numeral 514 denotes a switched capacitor.
Reference numeral 519 denotes a circuit for the provision of a clock circuit. Reference numerals 511 and 512 denote switching devices, each having two terminals 551, 552, 561 and 562 and a centre tap 553, 563.

The charge control circuit 520 comprises equivalent components.

Figure 5A:
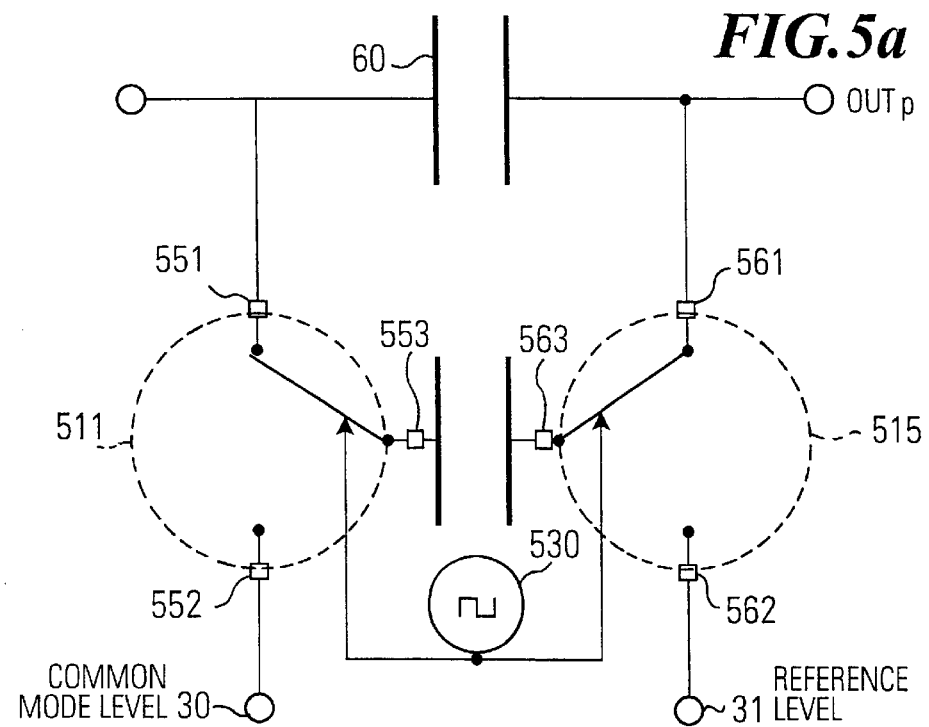
FIGS. 5a and 5b Show details of the embodiment of the charge control circuit of FIGS. 3 and 4 respectively.

FIG. 5a shows details of the embodiment of the charge control circuit of FIG. 3. One terminal of the switched capacitor 514 is connected to the centre tap 553 of a first switching device 511, and the other terminal of said switched capacitor 514 is connected to the centre tap 563 of the second switching device 515. One terminal 551 of said first switching device 511 is connected to the input side terminal of the capacitor 60. The other terminal 552 of said first switching device 511 is connected to a node 30 carrying the input common mode voltage level, as detected by the input common mode level detection circuit 40. One terminal 561 of said second switching device 515 is connected to the output side terminal of the capacitor 60. The other terminal 562 of said first switching device 515 is connected to a node 31 carrying a voltage representing a desired common mode level. The clock signal provision circuitry 519 is disposed so as to control the switching of said switching devices 511 and 515.

The components of charge control circuit 520 are arranged in an equivalent manner.

In operation, during a first phase of the clock signal delivered by said clock provision circuitry 519, the switch 511 is controlled so as to effect a connection between it's centre tap 553 and the first terminal 551 of said switch 511. During the same said first phase of the clock signal, the switch 515 is similarly controlled so as to effect a connection between it's centre tap 563 and the first terminal 561 of said switch 515.

During a second phase of the clock signal delivered by said clock provision circuitry 519, the switch 511 is controlled so as to effect a connection between it's centre tap 553 and the second terminal 552 of said switch 511. During the same said second phase of the clock signal, the switch 515 is similarly controlled so as to effect a connection between it's centre tap 563 and the second terminal 562 of said switch 515.

Thus in operation in a first phase of the clock signal delivered by said clock provision circuitry 519 the switched capacitor 514 is coupled in parallel with the capacitor 60, and in a second phase of the clock signal said switched capacitor 514 is coupled between the nodes 30 and 31, bearing voltages representing the common mode level of the input signal, and the desired common mode level respectively.

The charge control circuit 520 is arranged so as to operate in a similar manner.

The following information is provided as a guide to assist the choice of capacitor values best suited to the realisation of his embodiment of the invention.

The capacitance of the capacitor 60 is denoted Cdp.

The capacitance of the capacitor 61 is denoted Cdn.

The capacitance of the switched capacitor 514 is denoted Ccp.

The capacitance of the switched capacitor 524 is denoted Ccn.

Preferably, The capacitance of Cdp and Cdn should be substantially larger than the input differential capacitance of the receiver. This will minimize attenuation of the differential signal. For receivers with MOS transistor input stages or other inputs with capacitive input characteristics, the output differential signal from the differential signal transfer circuit is:

$$V_{outDiff} = V_{outDiffDC} + V_{inDiffAC} \times \frac{C_{dp} + C_{dn}}{C_{inDiffRcv} + C_{dp} + C_{dn}} \quad (1)$$

In this formula, $V_{outDiff}$ denotes the differential output voltage, $V_{outDiffDC}$ denotes the value of the direct current component of the differential output voltage, $V_{inDiffAC}$ denotes the value of the alternating current component of the differential output voltage and Ccp, Cdp, Ccn and Cdn refer to the values of the capacitors 514, 60, 525 and 61 shown in FIG. 3.

In the preferred embodiment of the invention, capacitors 514 and 525 and switches 511, 515, 521 and 525, serve to ensure that the DC component of the output differential signal $V_{diffoutDC}$ equals the DC component of the input differential signal $V_{inDiffDC}$. Together with the transfer function described in equation (1) this makes the output differential signal essentially equal to the input differential signal across the whole spectrum.

Also, the capacitors 514 and 524 and switches 511, 515, 521 and 525 can be taken to shape the common mode part of the output signal.

If the sum of capacitances $C_{dp}$ and $C_{dn}$ for capacitors 60 and 61 is $C_d$, and the sum of capacitance $C_{cp}$ and $C_{cn}$ for capacitors 514 and 524 is $C_c$, the common mode output voltage can be expressed in the z-domain as:

$$V_{outCm}(z) = \frac{V_{CmDes}C_c + V_{inCm}(z) \times [C_d(z-1) - C_c]}{(z-1)C_{inCmRcv}} \quad (2)$$

In the Nyquist range this can be expressed as:

$$V_{outCm} = V_{CmDes} + V_{inCm} \times \frac{C_d}{C_{inDiffRcv} + C_d} \times \frac{j\omega Tx \frac{C_d}{C_c}}{1 + j\omega Tx \frac{C_d}{C_c}} \quad (3)$$

Where ω is the angular frequency of the input common mode signal $V_{inCm}$ and T is the period of the clock signal operating switches 511, 515, 521 and 525. The switches in each pair 511 and 515, and 521 and 525, are operated in scheme with two main phases, one of which is shown in FIG. 3.

The other main phase has both switches flipped to the opposite position.

According to a straight forward implementation of the charge control circuit shown in FIG. 3, all four switches are in phase with one another, such that at any clock phase the four switches are either all forming a connection to a reference voltage 30, 31 or are all forming a connection to an input or an output of the transfer circuit 10, 11, 20, 21. It is noted that a specific phase relation between the clock phases of the two pairs of switches is not required. For example driving the two pairs from independent clock sources would be possible.

By choosing Cd, Cc and the switching period for the switches appropriately, the common mode high pass pole can be placed such that the bulk of the input common mode signal spectrum is rejected. In general, Cc will be much smaller than Cd. With a clock frequency between 40 and 50 MHz, a value of Cdp and Cdn might be approximately 4 pF, and Ccp and Ccn might be approximately 80 fF.

Figure 4A:
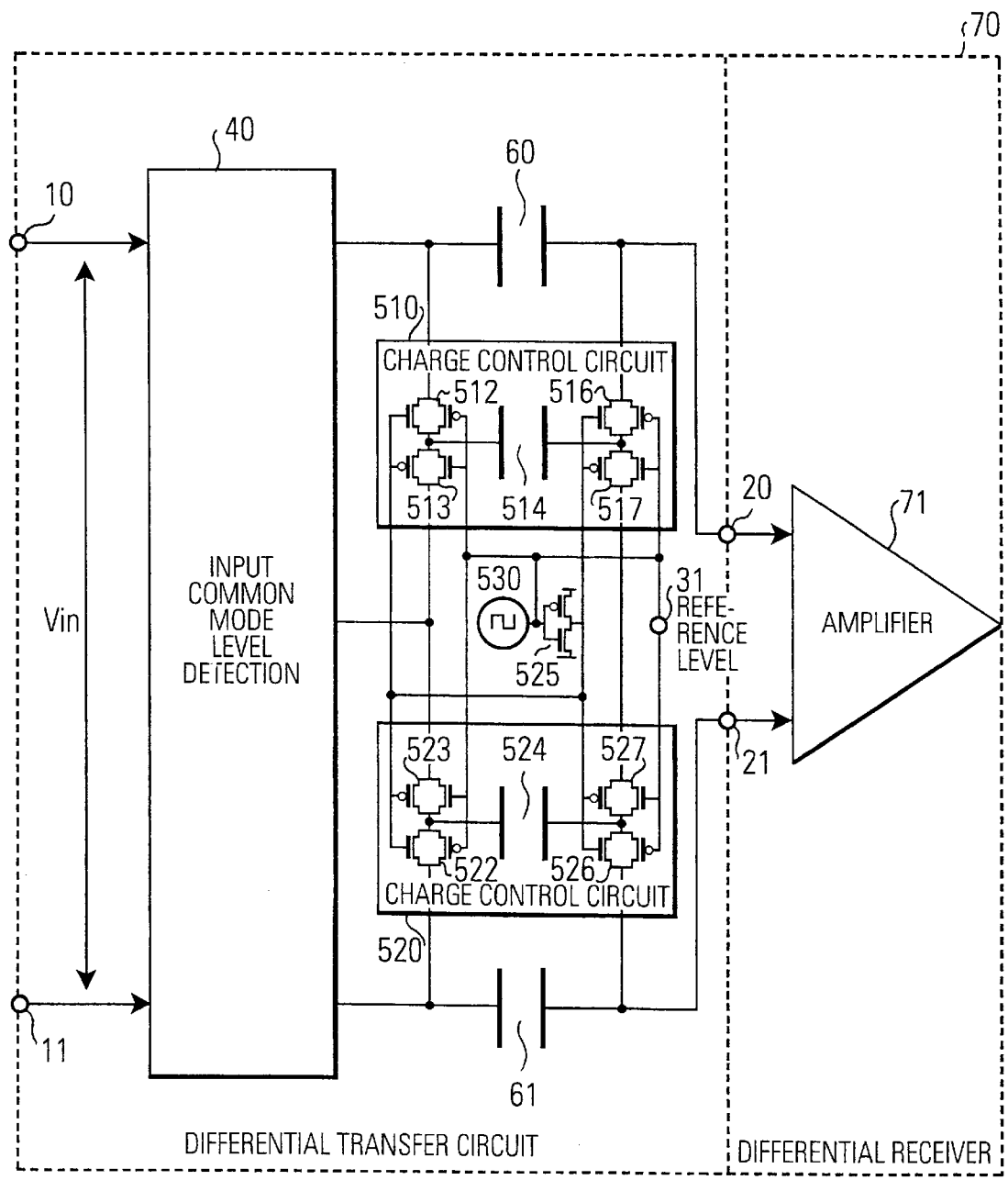
FIG. 4a Shows an embodiment of an implementation of the charge control circuits the embodiment of FIG. 2.
Figure 4B:
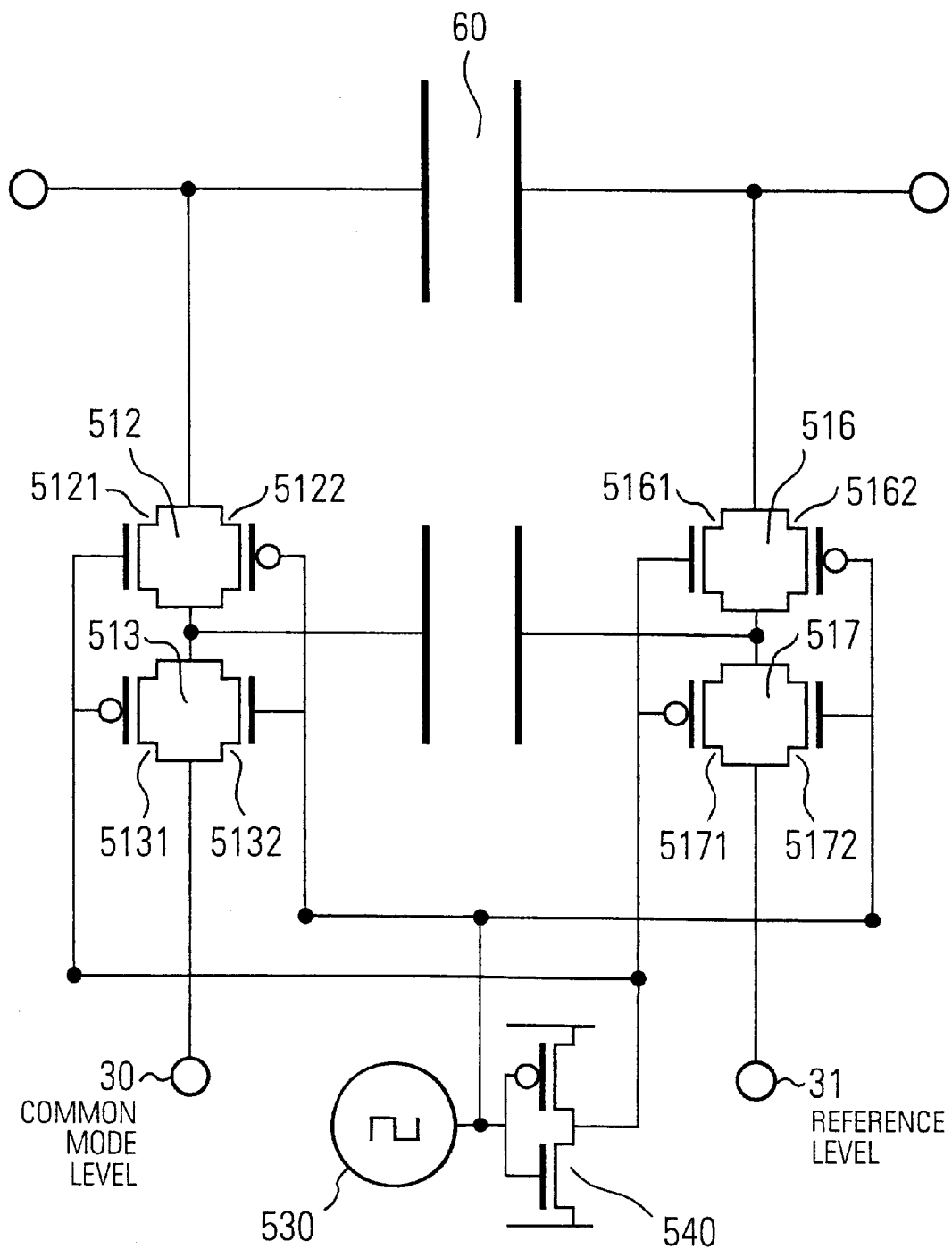

FIG. 4a shows a preferred implementation of the charge control circuit shown in FIG. 3, in which the switches are implemented as MOS transistors. More specifically, FIG. 4b shows details of the embodiment of an implementation of the charge control circuits embodiment of FIG. 4a, in which the charge control circuit 510 incorporates eight MOS transistors 5121, 5122, 5131, 5132, 5161, 5162, 5171 and 5172 forming four transmission gates 512, 513, 516, 517 and a switched capacitor 514. A clock signal generation circuit 530 and an inverter 540 which inverts the clock signal to provide an anti-clock signal 180° out of phase with said clock signal, are further provided.

The second charge control circuit 520 comprises equivalent components.

A first transmission gate 512 comprises an NMOS 5121 and a PMOS 5122 transistor whose sources are both connected to a first terminal 553 of the switched capacitor 514 and whose drains are connected to a first terminal 551 of the capacitor 60. The gate of the PMOS transistor is connected to the signal from the clock signal generation circuit 530, and the gate of the NMOS transistor is connected to the inverted clock signal at the output of the inverter 525.

A second transmission gate 513 comprises an NMOS 5132 and a PMOS 5131 transistor whose sources are both connected to a first terminal 553 of the switched capacitor 514 and whose drains are both connected to a node 552 carrying a voltage representing the input signal common mode level 30 as detected by the input common mode level detection circuit 40. The gate of the NMOS transistor 5132 is connected to the signal from the clock signal generation circuit 530, and the gate of the PMOS transistor 5131 is connected to the inverted clock signal at the output of the inverter 525.

A third transmission gate 516 comprises an NMOS 5161 and a PMOS 5162 transistor whose sources are both connected to a second terminal 563 of the switched capacitor 514 and whose drains are connected to a second terminal 561 of the capacitor 60. The gate of the PMOS transistor 5162 is connected to the signal from the clock signal generation circuit 530, and the gate of the NMOS 5161 transistor is connected to the inverted clock signal at the output of the inverter 525.

A fourth transmission gate 517 comprises an NMOS 5172 and a PMOS 5171 transistor whose sources are both connected to a first terminal 563 of the switched capacitor 514 and whose drains are connected to a node 562 carrying a voltage representing the desired common mode level 31. The gate of the NMOS 5172 transistor is connected to the signal from the clock signal generation circuit 530, and the gate of the PMOS transistor 5171 is connected to the inverted clock signal at the output of the inverter 525.

Thus the first NMOS and PMOS transistor pair 513 switch a connection between the common mode level at node 552 and a first terminal 553 of the switched capacitor 514, switched by the clock signal and the inverted clock signal respectively, a second NMOS and PMOS transistor pair 513 switch a connection between a differential transfer circuit input side of the first capacitor 60 at node 551 and said first terminal 553 of the switched capacitor 514, switched by the inverted clock signal and the clock signal respectively, a third NMOS and PMOS transistor pair 517 switch a connection between a reference level 31 at node 562 and a second terminal 563 of the capacitor, switched by the clock signal and the inverted clock signal respectively, and a fourth NMOS and PMOS transistor pair 516 switch a connection between a differential transfer circuit output side at node 561 of the first capacitor 60 and said second terminal 563 of the switched capacitor 514, switched by the inverted clock signal and the clock signal respectively.

The components of the charge control circuit 520 are arranged in a similar manner.

In operation, during a first phase of said clock a circuit will exist through the first and third transmission gates 512 and 516, but not through the second and fourth transmission gates 513 and 517, due to the opposite arrangements of these gates, whereby the PMOS transistors of the first and third transmission gates are controlled by the inverted clock signal, and in the second and fourth transmission gates by the non inverted clock signal. Thus during a first phase of said clock signal the switched capacitor (514, 524) is connected in parallel with the capacitor coupled between the input and the output of the transfer circuit, and during a second phase of said clock the switched capacitor (514, 524) is connected between the reference voltage (31) and the detected common mode voltage (30).

The second charge control circuit 520 operates in a similar manner.

The values of the reference levels are preferably equal. Making the reference levels different can be effective in imposing a differential DC offset onto the signal at the output of the differential signal transfer circuit. According to the embodiment of the invention as shown in FIG. 4, they are derived from a single source 31.

Figure 5B:
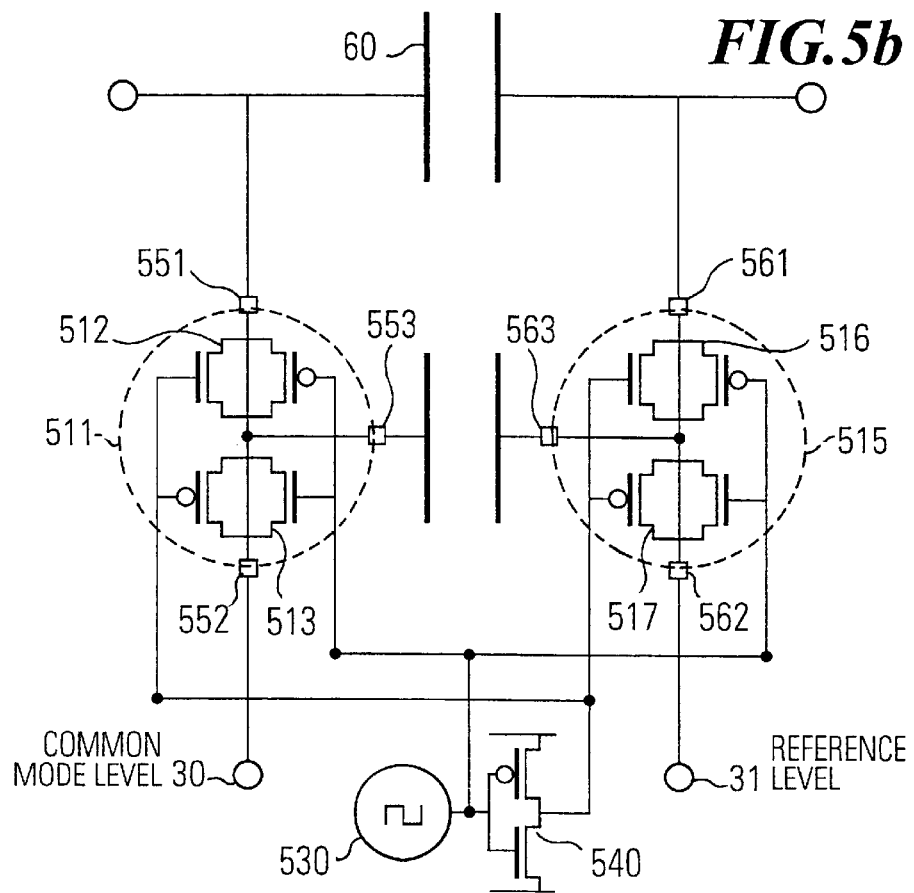

FIG. 5a shows details of one of the charge control circuits of the embodiment of FIG. 3. FIG. 5b shows details of one of the charge control circuits of the embodiment of FIG. 4. By reference to the nodes 553 and 563 situated between the switched capacitor and the switches 511 and 515 respectively, 551 between the input side of the first capacitor 60 and the switch, 561 between the output side of the first capacitor 60 and the switch 511, 552 between the common mode level 30 and the switch 511, and 562 between the reference voltage 31 and the switch 515, it is possible to see how the transistor implementation of the switched devices as shown in FIG. 4 can be mapped onto the embodiment of FIG. 3.

The detection of the common mode input value can be realised according to a variety of techniques.

Figure 6:
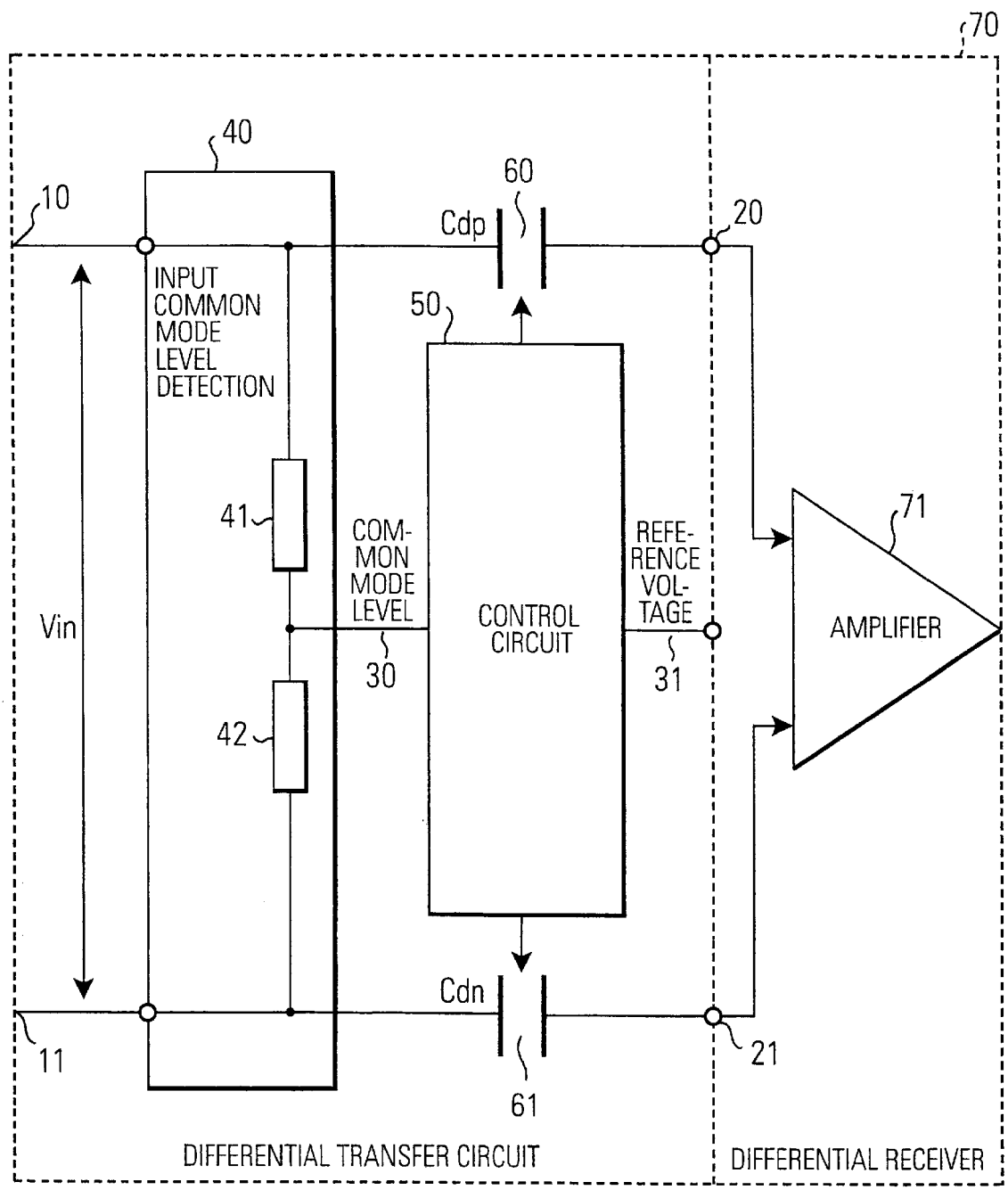
FIG. 6 Shows an embodiment of the common mode detection circuit of FIG. 1.

FIG. 6 Shows an embodiment of the common mode detection circuit of FIG. 1. This embodiment involves the provision of two resistors R1 (41) and R2 (42) in a potential divider arrangement between the two inputs (19, 11). The values of these resistors are preferably substantially equal. The centre voltage (30) is taken to be representative of the common node voltage of the input signal.

Another method may be derived for example from the patent EP 0 840 442 A1 referred to above, which uses a switched capacitor network for the detection of a common mode signal.

What is claimed is:

1. A differential signal transfer circuit to control the common mode level of a differential signal, comprising:
   a first and second input terminal for connection with a differential transmission line;
   a first and a second output terminal for connection with the inputs of a differential line receiver;
   an input common mode level detection circuit, for detecting the common mode level of an incoming signal across said first and second input terminals;
   a first capacitor coupled between said first input terminal and said first output terminal;
   a second capacitor coupled between said second input terminal and said second output terminal; and
   a control circuit adapted to control an output common mode voltage level at the first and second output terminals by controlling the levels of charge on the first and second capacitors dependent on the common mode level of the incoming signal as detected by the input common mode level detection circuit.

2. The differential signal transfer circuit of claim 1 wherein said control circuit comprises a clock circuit, and a first charge control circuit for said first capacitor, the first charge control circuit having:
   a first-charge-control-circuit capacitor; and
   a first first-charge-control-circuit switching device and a second first-charge-control-circuit switching device, which are switched in an in phase manner by said clock circuit so as to,
   in a first stage of a cycle of said clock circuit to connect said first-charge-control-circuit capacitor across the output signal of the input common mode level detection circuit, representing the common mode level on the incoming signal, and a reference level,
   in a second stage of a cycle of said clock circuit to connect said first-charge-control-circuit capacitor in parallel with the first capacitor with which said first charge control circuit is associated.

3. The differential signal transfer circuit of claim 2 wherein a frequency of the cycle of said clock circuit is higher than twice a highest frequency at an appreciable power level in a common mode signal spectrum.

4. The differential signal transfer circuit of claim 1 wherein said control circuit comprises, a first charge control circuit for said first capacitor, the first charge control circuit having:
   a first-charge-control-circuit capacitor;
   a first-charge-control-circuit clock circuit; and
   a first first-charge-control-circuit switching device and a second first-charge-control-circuit switching device, which are switched in an in phase manner by said first-charge-control-circuit clock circuit so as to alternately connect,
   in a first stage of a cycle of said first-charge-control-circuit clock circuit to connect said first-charge-control-circuit capacitor across the output signal of the input common mode level detection circuit, representing the common mode level on the incoming signal, and a reference level with which said first charge control circuit is associated,
   in a second stage of a cycle of said first-charge-control-circuit clock circuit to connect said first-charge-control-circuit capacitor in parallel with the first capacitor with which said first charge control circuit is associated.

5. The differential signal transfer circuit of claim 4 wherein a frequency of the cycle of said first-charge-control-circuit clock circuit is higher than twice a highest frequency at an appreciable power level in a common mode signal spectrum.

6. The differential signal transfer circuit of claim 2 wherein the first first-charge-control-circuit switching device and the second first-charge-control-circuit switching device are implemented using transistor transmission gates.

7. The differential signal transfer circuit of claim 1 wherein the input common mode detection circuit comprises a first resistive element and a second resistive element coupled in series across the first and second input terminals so as to form a potential divider arrangement, the voltage between the resistive elements being representative of a common mode value of an input signal to the first and second input terminals.

8. The differential signal transfer circuit of claim 1, wherein a reference voltage is provided for said control circuit.

9. The differential signal transfer circuit of claim 2 wherein said control circuit further comprises a second charge control circuit for said second capacitor, the second charge control circuit having:
   a second-charge-control-circuit capacitor; and
   a first second-charge-control-circuit switching device and a second second-charge-control-circuit switching device, which are switched in an in phase manner by said clock circuit so as to,
   in a first stage of a cycle of a said clock circuit to connect said second-charge-control-circuit capacitor across the output signal of the input common mode level detection circuit, representing the common mode level an the incoming signal, and a reference level,
   in a second stage of a cycle of said clock circuit to connect said second-charge-control-circuit capacitor in parallel with the second capacitor with which said second charge control circuit is associated.

10. The differential signal transfer circuit of claim 4 wherein said control circuit comprises, a second charge control circuit for said second capacitor, the second charge control circuit having:
   a second-charge-control-circuit capacitor;
   a second-charge-control-circuit clock circuit; and
   a first second-charge-control-circuit switching device and a second second-charge-control-circuit switching device, which are switched in an in phase manner by said second-charge-control-circuit clock circuit so as to alternately connect,
   in a first stage of a cycle of said second-charge-control-circuit clock circuit to connect said second-charge-control-circuit capacitor across the output signal of the input common mode level detection circuit, representing the common mode level on the incoming signal, and a reference level with which said second charge control circuit is associated,
   in a second stage of a cycle of said first-charge-control-circuit clock circuit to connect said second-charge-control-circuit capacitor in parallel with the second capacitor with which said second charge control circuit is associated.

11. The differential signal transfer circuit of claim 10 wherein the frequencies of the first-charge-control-circuit clock circuit and the second-charge-control-circuit clock circuit are equal.

12. The differential signal transfer circuit of claim 4 wherein the first first-charge-control-circuit switching device and the second first-charge-control-circuit switching device are implemented using transistor transmission gates.

13. The differential signal transfer circuit of claim 9 wherein the first second-charge-control-circuit switching device and the second second-charge-control-circuit switching device are implemented using transistor transmission gates.

14. The differential signal transfer circuit of claim 10 wherein the first second-charge-control-circuit switching device and the second second-charge-control-circuit switching device are implemented using transistor transmission gates.

* * * * *